(12) United States Patent
Hong

(10) Patent No.: US 9,437,586 B2
(45) Date of Patent: Sep. 6, 2016

(54) SEMICONDUCTOR PACKAGE AND METHOD OF FABRICATING THE SAME

(71) Applicant: Min Gi Hong, Asan-si (KR)

(72) Inventor: Min Gi Hong, Asan-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 16 days.

(21) Appl. No.: 14/503,575

(22) Filed: Oct. 1, 2014

(65) Prior Publication Data
US 2015/0108663 A1 Apr. 23, 2015

(30) Foreign Application Priority Data
Oct. 22, 2013 (KR) ........................ 10-2013-0126140

(51) Int. Cl.
*H01L 25/18* (2006.01)
*H01L 23/00* (2006.01)
(Continued)

(52) U.S. Cl.
CPC ............... *H01L 25/18* (2013.01); *H01L 23/13* (2013.01); *H01L 23/5384* (2013.01); *H01L 23/5389* (2013.01); *H01L 24/24* (2013.01); *H01L 24/49* (2013.01); *H01L 25/0652* (2013.01); *H01L 25/0657* (2013.01); *H01L 25/50* (2013.01); *H01L 23/3128* (2013.01); *H01L 23/49816* (2013.01); *H01L 24/06* (2013.01); *H01L 24/16* (2013.01); *H01L 24/32* (2013.01); *H01L 24/45* (2013.01); *H01L 24/48* (2013.01); *H01L 24/73* (2013.01); *H01L 24/92* (2013.01); *H01L 2224/0401* (2013.01); *H01L 2224/04042* (2013.01); *H01L 2224/05553* (2013.01); *H01L 2224/06134* (2013.01); *H01L 2224/06135* (2013.01); *H01L 2224/06136* (2013.01); *H01L 2224/16227* (2013.01); *H01L 2224/24227* (2013.01); *H01L 2224/32145* (2013.01); *H01L 2224/32225* (2013.01); *H01L 2224/45139* (2013.01); *H01L 2224/4824* (2013.01); *H01L 2224/48091* (2013.01); *H01L 2224/48137* (2013.01); *H01L 2224/48145* (2013.01); *H01L 2224/48147* (2013.01); *H01L 2224/48227* (2013.01); *H01L 2224/49097* (2013.01);
(Continued)

(58) Field of Classification Search
CPC .............. H01L 2924/15153; H01L 2924/146; H01L 2924/1436; H01L 2424/1434
See application file for complete search history.

(56) References Cited

U.S. PATENT DOCUMENTS 4,982,265 A * 1/1991 Watanabe ................ G11C 5/00
174/551
5,903,492 A * 5/1999 Takashima .............. G11C 11/22
257/E27.104
(Continued)

FOREIGN PATENT DOCUMENTS

| KR | 10-2008-0016124 A | 2/2008 |
|---|---|---|
| KR | 10-2008-0067891 A | 7/2008 |
| KR | 10-2011-0107117 A | 9/2011 |

*Primary Examiner* — Earl Taylor
(74) *Attorney, Agent, or Firm* — Harness, Dickey & Pierce, P.L.C.

(57) ABSTRACT

Provided is a semiconductor package in which a cell array region and a peripheral circuit region are formed as different semiconductor chips, respectively. First semiconductor chips including memory cells and a second semiconductor chip including only peripheral circuitry common to the first semiconductor chips are electrically connected to each other. Thus, a loading capacitance of the semiconductor package may be reduced. As a result, an RC delay of the semiconductor package may be reduced, thereby improving an operating speed of the semiconductor package.

11 Claims, 14 Drawing Sheets

(51) Int. Cl.
H01L 25/065 (2006.01)
H01L 23/13 (2006.01)
H01L 25/00 (2006.01)
H01L 23/538 (2006.01)
H01L 23/31 (2006.01)
H01L 23/498 (2006.01)

(52) U.S. Cl.
CPC ........... *H01L2224/49109* (2013.01); *H01L 2224/49112* (2013.01); *H01L 2224/49175* (2013.01); *H01L 2224/73207* (2013.01); *H01L 2224/73265* (2013.01); *H01L 2224/73267* (2013.01); *H01L 2224/92127* (2013.01); *H01L 2224/92247* (2013.01); *H01L 2225/0651* (2013.01); *H01L 2225/06506* (2013.01); *H01L 2225/06517* (2013.01); *H01L 2225/06562* (2013.01); *H01L 2924/00014* (2013.01); *H01L 2924/1434* (2013.01); *H01L 2924/1436* (2013.01); *H01L 2924/1438* (2013.01); *H01L 2924/15151* (2013.01); *H01L 2924/15153* (2013.01); *H01L 2924/15172* (2013.01); *H01L 2924/15192* (2013.01); *H01L 2924/15311* (2013.01); *H01L 2924/181* (2013.01)

(56) References Cited

U.S. PATENT DOCUMENTS

| | | | | |
|---|---|---|---|---|
| 5,970,002 A * | 10/1999 | Yoo | G11C 29/80 | 365/200 |
| 6,049,129 A * | 4/2000 | Yew | H01L 23/24 | 257/737 |
| 6,091,624 A * | 7/2000 | Kang | G11C 11/22 | 365/145 |
| 6,240,007 B1 * | 5/2001 | Kang | G11C 11/22 | 365/145 |
| 6,262,488 B1 * | 7/2001 | Masayuki | G11C 5/00 | 257/673 |
| 6,721,199 B2 * | 4/2004 | Kang | G11C 11/22 | 365/145 |
| 6,930,339 B2 * | 8/2005 | Higuchi | H01L 27/105 | 257/295 |
| 7,420,867 B2 * | 9/2008 | Brox | G11C 7/22 | 365/230.03 |
| 7,435,097 B2 * | 10/2008 | Mecker | G11C 5/04 | 174/260 |
| 8,223,523 B2 * | 7/2012 | Jin | G11C 5/04 | 257/774 |
| RE43,720 E * | 10/2012 | Perino | H01L 23/3128 | 174/538 |
| 8,354,742 B2 | 1/2013 | Camacho et al. | | |
| 8,472,199 B2 * | 6/2013 | Kim | G06F 3/0626 | 235/380 |
| 8,476,111 B2 * | 7/2013 | Cho | H01L 23/13 | 257/668 |
| 8,546,946 B2 | 10/2013 | Nin | | |
| 8,659,136 B2 * | 2/2014 | Youn | G11C 5/02 | 257/686 |
| 8,680,605 B2 * | 3/2014 | Jeon | G11C 16/0483 | 257/314 |
| 8,803,336 B2 * | 8/2014 | Lee | H01L 25/0652 | 257/777 |
| 8,896,126 B2 * | 11/2014 | Setardja | H01L 23/13 | 257/685 |
| 9,076,531 B2 * | 7/2015 | Arakawa | G11C 16/06 | |
| 2002/0114178 A1 | 8/2002 | Sakui | G06F 13/4234 | 365/51 |
| 2002/0155666 A1 * | 10/2002 | Higuchi | H01L 27/105 | 438/295 |
| 2003/0064547 A1 * | 4/2003 | Akram | H01L 23/5386 | 438/108 |
| 2003/0160316 A1 * | 8/2003 | Shieh | H01L 21/563 | 257/686 |
| 2003/0179635 A1 * | 9/2003 | Terzioglu | G11C 29/50 | 365/201 |
| 2004/0183179 A1 | 9/2004 | Shieh et al. | | |
| 2004/0245617 A1 * | 12/2004 | Damberg | H01L 25/0652 | 257/686 |
| 2005/0077607 A1 * | 4/2005 | Hsieh | H01L 23/13 | 257/679 |
| 2006/0164820 A1 * | 7/2006 | Mecker | G11C 5/04 | 361/760 |
| 2006/0268519 A1 * | 11/2006 | Bartley | H01L 25/105 | 361/699 |
| 2007/0069374 A1 * | 3/2007 | Chen | H01L 23/5388 | 257/723 |
| 2007/0228546 A1 * | 10/2007 | So | H01L 25/0657 | 257/690 |
| 2007/0241441 A1 * | 10/2007 | Choi | H01L 25/0652 | 257/686 |
| 2008/0106860 A1 * | 5/2008 | Jafari | G06F 1/183 | 361/679.31 |
| 2008/0112251 A1 * | 5/2008 | Youn | G11C 5/025 | 365/230.03 |
| 2008/0150111 A1 * | 6/2008 | Hiller | H01L 24/49 | 257/686 |
| 2009/0121336 A1 * | 5/2009 | Kim | H01L 24/49 | 257/686 |
| 2009/0243064 A1 * | 10/2009 | Camacho | H01L 23/3121 | 257/680 |
| 2010/0127381 A1 * | 5/2010 | Shin | H01L 23/13 | 257/692 |
| 2010/0135056 A1 * | 6/2010 | Hotta | G11C 7/18 | 365/63 |
| 2010/0244227 A1 * | 9/2010 | Kim | H01L 23/3128 | 257/692 |
| 2010/0295166 A1 * | 11/2010 | Kim | H01L 21/56 | 257/692 |
| 2010/0301466 A1 * | 12/2010 | Taoka | H01L 21/563 | 257/686 |
| 2011/0089553 A1 * | 4/2011 | Kim | H01L 23/13 | 257/686 |
| 2011/0115100 A1 * | 5/2011 | Okumura | H01L 24/48 | 257/782 |
| 2011/0156232 A1 * | 6/2011 | Youn | G11C 5/02 | 257/686 |
| 2011/0161583 A1 * | 6/2011 | Youn | G11C 7/02 | 711/115 |
| 2011/0286275 A1 * | 11/2011 | Jeon | G11C 16/0483 | 365/185.77 |
| 2012/0043671 A1 * | 2/2012 | Nishiyama | H01L 24/48 | 257/777 |
| 2012/0049361 A1 * | 3/2012 | Park | G11C 5/025 | 257/738 |
| 2012/0096322 A1 * | 4/2012 | Huh | G06F 11/1008 | 714/719 |
| 2012/0133055 A1 * | 5/2012 | Machida | H01L 24/06 | 257/777 |
| 2012/0153432 A1 * | 6/2012 | Karakane | H01L 23/13 | 257/528 |
| 2012/0267776 A1 * | 10/2012 | Nin | H01L 23/481 | 257/737 |
| 2012/0281449 A1 * | 11/2012 | Kim | G11C 5/063 | 365/63 |
| 2012/0292759 A1 * | 11/2012 | Ishikawa | H01L 22/34 | 257/737 |
| 2012/0314511 A1 * | 12/2012 | Ishikawa | G01R 31/2884 | 365/189.05 |
| 2012/0317332 A1 * | 12/2012 | Kwak | G06F 12/0246 | 711/102 |
| 2012/0317352 A1 * | 12/2012 | Kang | G11C 11/40611 | 711/106 |
| 2012/0319263 A1 * | 12/2012 | Cho | H01L 23/13 | 257/690 |
| 2013/0010517 A1 * | 1/2013 | Chu | G11C 5/06 | 365/63 |
| 2013/0014269 A1 * | 1/2013 | Chang | G06F 21/79 | 726/26 |
| 2013/0021760 A1 * | 1/2013 | Kim | H01L 25/0657 | 361/729 |
| 2013/0037944 A1 * | 2/2013 | Lee | H01L 25/0657 | 257/737 |

(56) References Cited

U.S. PATENT DOCUMENTS

| | | | |
|---|---|---|---|
| 2013/0049224 A1* | 2/2013 | Sutardja | H01L 23/13 257/774 |
| 2013/0070507 A1* | 3/2013 | Yoon | G11C 7/1057 365/51 |
| 2013/0113115 A1* | 5/2013 | Wang | H01L 25/0652 257/777 |
| 2013/0119542 A1* | 5/2013 | Oh | H01L 25/0657 257/738 |
| 2013/0198589 A1* | 8/2013 | Choi | G06F 11/1072 714/773 |
| 2013/0201743 A1* | 8/2013 | Zhang | G11C 5/02 365/51 |
| 2013/0272082 A1* | 10/2013 | Kim | G11C 11/402 365/203 |
| 2013/0326188 A1* | 12/2013 | Suh | H01L 25/00 711/206 |
| 2014/0036566 A1* | 2/2014 | Zhang | G11C 5/02 365/63 |
| 2014/0097513 A1* | 4/2014 | Lee | H01L 23/49816 257/528 |
| 2014/0117430 A1* | 5/2014 | Lee | H01L 23/5385 257/296 |
| 2014/0124921 A1* | 5/2014 | Lee | H01L 25/0652 257/737 |
| 2014/0185389 A1* | 7/2014 | Jeon | G11C 7/1093 365/189.05 |
| 2015/0076687 A1* | 3/2015 | Sutardja | H01L 23/13 257/713 |
| 2015/0108663 A1* | 4/2015 | Hong | H01L 25/0657 257/777 |

* cited by examiner

| CJ | SWD | CJ | SWD | CJ | SWD | CJ |
|---|---|---|---|---|---|---|
| BLSA | BLK | BLSA | BLK | BLSA | BLK | BLSA |
| CJ | SWD | CJ | SWD | CJ | SWD | CJ |
| BLSA | BLK | BLSA | BLK | BLSA | BLK | BLSA |
| CJ | SWD | CJ | SWD | CJ | SWD | CJ |

SEMICONDUCTOR PACKAGE AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2013-0126140, filed on Oct. 22, 2013, the entirety of which is hereby incorporated by reference.

BACKGROUND

With advances in the electronic industry, demand for higher-performance, faster-speed, and smaller-sized (compact) electronic components are increasing. Along with this trend, one of the present semiconductor package technologies is to stack (e.g., mount) a plurality of memory chips on a single package substrate. If the memory chips are stacked, however, an input capacitance of a resultant semiconductor package including the stacked memory chips increases, thereby resulting in a decrease in speed. Further, die bonding processes and wire bonding processes, which may be continuously repeated with respect to each memory chip, tend to make the overall process complex.

SUMMARY

At least some example embodiments provide semiconductor packages and/or methods of fabricating the same.

A semiconductor package according to an example embodiment includes a package substrate, a first semiconductor chip at a the central region of the package substrate, the first semiconductor chip including a peripheral circuit region having peripheral circuits; and second semiconductor chips stacked on both sides of the first semiconductor chip on the package substrate, each of the second semiconductor chips including a cell array region in which memory cells are disposed, the peripheral circuits in the first semiconductor chip configured to drive the memory cells in the second semiconductor chips.

In some example embodiments, the peripheral circuit region may further include at least one of a conjunction region and a bitline sense amplifier region.

In some example embodiments, the package substrate may include a hole formed in the central region thereof. The first semiconductor chip may overlap the hole and may be mounted on a bottom surface of the package substrate. The second semiconductor chips may be on a top surface of the package substrate. The first semiconductor chip and the second semiconductor chips may be electrically connected to each other by wires disposed through the hole.

In some example embodiments, the semiconductor package may further include a mold layer covering the first semiconductor chip and the second semiconductor chips and filling the hole.

In some example embodiments, a portion of the hole may be exposed by the first semiconductor chip. A distance between one side surface of the first semiconductor chip and one side surface of the hole may be about 500 μm or more.

In some example embodiments, the package substrate may include a substrate conductive pattern disposed on a top surface of the package substrate and adjacent to the hole. The second semiconductor chips may include wiring conductive patterns disposed at their respective end portions. Some of the wiring conductive patterns may be connected to the substrate conductive pattern by a wire. In some example embodiments, a ground/power supply voltage may be applied to the substrate conductive pattern.

In some example embodiments, the second semiconductor chips may be identical to each other, the first semiconductor chip includes a first side and a second side being opposite to the first side, and a first group of the second semiconductor chips disposed at the first side of the first semiconductor chip and a second group of the second semiconductor chips disposed at the second side of the first semiconductor chip are symmetrically disposed to each other.

In some example embodiments, the second semiconductor chips may be identical to each other, and a number of the second semiconductor chips disposed at a first side of the first semiconductor chip may be different from a number of the second semiconductor chips disposed at a second side, which is opposite to the first side, of the first semiconductor chip.

In some example embodiments, the package substrate may include an upper recessed portion disposed at the central region thereof, and the first semiconductor chip may be disposed in the upper recessed portion. In this case, the package substrate may further include a substrate conductive pattern disposed on a bottom of the upper recessed portion, the first semiconductor chip may include a first chip conductive pattern and a second chip conductive pattern, the first and second chip conductive patterns are on a top surface of the first semiconductor chip, the first chip conductive pattern may be electrically connected to the second semiconductor chips, and the second chip conductive pattern may be electrically connected to the substrate conductive pattern.

In some example embodiments, the first semiconductor chip may be embedded in the package substrate. The package substrate may include a substrate conductive pattern and a substrate internal interconnection. The substrate internal interconnection may be disposed on its top surface. The substrate internal interconnection may be disposed in the package substrate and be connected to the substrate conductive pattern. The first semiconductor chip and the second semiconductor chips may be electrically connected to each other by the substrate conductive pattern and the substrate internal interconnection.

In some example embodiments, the package substrate may include a lower recessed portion disposed at the central region thereof. The first semiconductor chip may be disposed in the lower recessed portion. The first semiconductor chip may include a chip conductive pattern on a bottom surface thereof and the package substrate may include a first substrate conductive pattern on a top surface thereof, a substrate internal interconnection therein, and a second substrate conductive pattern on a bottom surface thereof. The second substrate conductive pattern connects the substrate internal interconnection and the chip conductive pattern to each other. The first semiconductor chip and the second semiconductor chips may be electrically connected to each other by wires, the first substrate conductive pattern, the substrate internal interconnection, and the second substrate conductive pattern.

A semiconductor package according to another example embodiment includes a package substrate, a first semiconductor chip mounted on the package substrate and including a peripheral circuit region in which peripheral circuits are disposed, and at least one second semiconductor chip mounted on the package substrate and including a cell array region in which memory cells are disposed. The peripheral circuit may be configured to drive the memory cells.

A method of fabricating a semiconductor package according to an example embodiment includes stacking first semiconductor chips on a package substrate, each of the first semiconductor chips including a cell array region in which memory cells are disposed, mounting a second semiconductor chip on the package substrate, the second semiconductor chip including a peripheral circuit region having peripheral circuits, the peripheral circuit for driving the memory cells, and forming a wire to electrically connect the first semiconductor chips and the second semiconductor chip to each other.

A semiconductor package according to still another example embodiment includes a package substrate, a plurality of first semiconductor chips each including memory cells, and a second semiconductor chip including peripheral circuitry common to the first semiconductor chip. The peripheral circuitry is configured to drive together the memory cells included in two or more of the first semiconductor chips. Each of the first semiconductor chips does not include a peripheral circuitry configured to drive the memory cell and the second semiconductor chip does not include memory cells.

The package substrate may include a top surface, a bottom surface, and a hole defined at a location, the first semiconductor chips may be provided on the top surface, and the second semiconductor chip may be provided on a bottom surface and overlaps with the hole.

The second semiconductor chip may be disposed to not entirely cover the hole.

The package substrate may include a recessed portion on one of a surface of the package substrate, and the second semiconductor chip may be in the recessed portion.

BRIEF DESCRIPTION OF THE DRAWINGS

The inventive concepts will become more apparent in view of the attached drawings and accompanying detailed description. The example embodiments depicted therein are provided by way of example, not by way of limitation, wherein like reference numerals refer to the same or similar elements. The drawings are not necessarily to scale, instead emphasis is placed upon illustrating aspects of the inventive concepts.

FIG. 4 shows a layout indicating various circuit blocks in a cell array region of a DRAM device.

DETAILED DESCRIPTION

Figure 1:
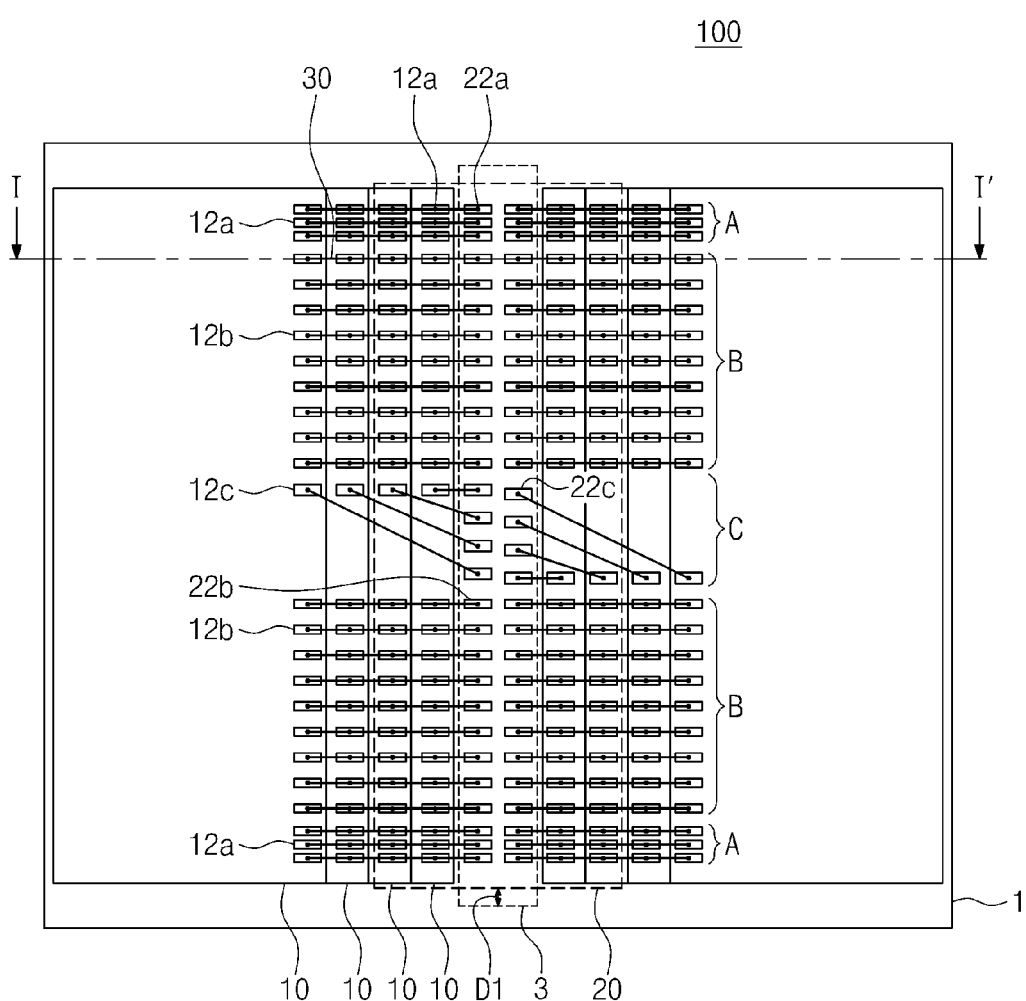
FIG. 1 is a layout of a semiconductor package according to an example embodiment.

The advantages and features of the inventive concepts and methods of achieving them will be apparent from the following example embodiments that will be described in more detail with reference to the accompanying drawings. It should be noted, however, that the inventive concepts is not limited to the following example embodiments, and may be implemented in various forms. Accordingly, the example embodiments are merely provided so that this disclosure will be thorough and complete, and will fully convey the scope of example embodiments to those skilled in the art.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. In the drawings, thicknesses of elements are exaggerated for clarity of illustration.

Example embodiments of the invention will be described below with reference to cross-sectional views, which are schematic illustrations of idealized example embodiments (and intermediate structures). The example drawings may be modified by manufacturing techniques and/or tolerances. Accordingly, the example embodiments should not be construed as limited to specific configurations shown in the drawings, but are to include modifications in shape that result, for example, from manufacturing methods. For example, an etched region shown at a right angle may be formed in a rounded shape or formed to have a desired (or alternatively, predetermined) curvature. Therefore, regions shown in the drawings have schematic characteristics. In addition, the shapes of the regions shown in the drawings are particular examples of shapes of regions in an element, and are not limited thereto. Though terms like a first, a second, and a third are used to describe various elements in various example embodiments, the elements are not limited by these terms. These terms are used only to tell one element from another element. The example embodiments described herein include complementary embodiments thereof.

The terms used in the specification are for the purpose of describing particular example embodiments only and are not intended to be limiting of the example embodiments. As used in the specification, the singular forms "a", "an" and "the" are intended to include the plural forms as well, unless the context dearly indicates otherwise. It will be further understood that the terms "comprises" and/or "comprising", when used in the specification, specify the presence of stated features, integers, steps, operations, elements, and/or components, but do not preclude the presence or addition of one or more other features, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Hereinafter, some example embodiments will now be described more fully with reference to accompanying drawings.

Figure 2:
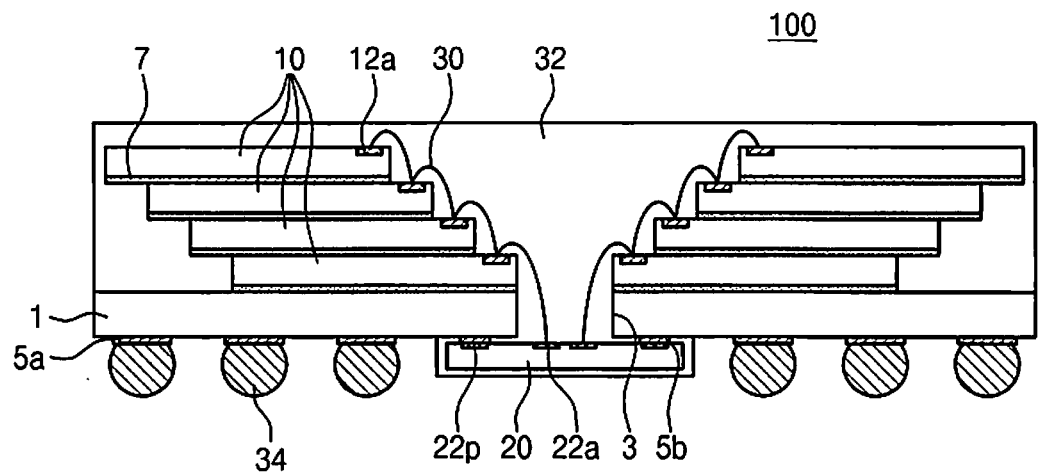
FIG. 2 is a cross-sectional view taken along the line I-I' in FIG. 1.

FIG. 1 is a layout of a semiconductor package 100 according to an example embodiment, and FIG. 2 is a cross-sectional view taken along the line I-I' in FIG. 1. In the semiconductor package 100, a package substrate 1 has a hole 3 formed in its center. The hole 3 may be in the form of a bar that is elongated in one direction. First substrate conductive patterns 5a and second substrate conductive patterns 5b are disposed on a bottom surface of the package substrate 1. The package substrate 1 may be a single-layer or multi-layer printed circuit board (PCB). First semiconductor chips are sequentially stacked on the package substrate 1 to be adjacent to the hole 3. An adhesive layer 7 is disposed between the first semiconductor chips 10 and between the lowermost first semiconductor chip 10 and the semiconductor substrate 1. Edges of the first semiconductor chips form a stepped shape. First to third wiring conductive patterns 12a, 12b, and 12c are disposed at the end portions of the first semiconductor chips 10, respectively.

A second semiconductor chip 20 is mounted on the bottom surface of the package substrate 1. The second semiconductor chip 20 is mounted to overlap the hole 3. A portion of the hole 3 may be exposed without being covered with the second semiconductor chip 20. A distance D1 between one side surface of the semiconductor chip 20 and one side surface of the hole 3, at which the hole 3 is not covered with the second semiconductor chip 20, may be 500 micrometers or more.

First to fourth chip conductive patterns 22a, 22b, 22c, and 22p are disposed on one surface of the second semiconductor chip 20. The fourth chip conductive pattern 22p is electrically connected to the second chip conductive pattern 5b. Although not shown, a solder ball may be disposed between the fourth chip conductive pattern 22p and the second chip conductive pattern 5b. The second semiconductor chip 20 may be mounted on the bottom surface of the package substrate 1 in a flip-chip bonding method. The first to third chip conductive patterns 22a, 22b, and 22c may be exposed by the hole 3. An external solder ball 34 may be attached to the first substrate conductive pattern 5a.

The eleventh chip conductive patterns 12a and the first chip conductive patterns 22a may be disposed in a first region "A". The eleventh chip conductive patterns 12a and the first chip conductive patterns 22a disposed on one column may be connected by a single wire 30. The eleventh chip conductive patterns 12a and the first chip conductive patterns 22a may each correspond to a ground pin or a power pin.

The twelfth chip conductive patterns 12b and the second chip conductive patterns 22b may be disposed in a second region "B". The twelfth chip conductive patterns 12b and the second chip conductive patterns 22b disposed on one column may be connected by the single wire 30. The twelfth chip conductive patterns 12b and the second chip conductive patterns 22b may each correspond to a data pin, an address pin or a command pin.

The thirteenth chip conductive patterns 12c and the third chip conductive patterns 22c may be disposed in a third region "C". Each of the third wiring conductive patterns 12c and each of the third chip conductive patterns 22c may be connected by the single wire 30. The third wiring conductive patterns 12c and the third chip conductive patterns 22c may each correspond to a chip enable pin.

For example, one group of the first semiconductor chips 10 disposed at one side of the second semiconductor chip 20 and another group of the first semiconductor chips 10 disposed at another side (which is opposite to the first side) of the second semiconductor chip 20 are symmetrically disposed to each other about a vertical axis running through the center of the package substrate 1. The first semiconductor chips 10 may each correspond to a memory cell chip including the same or similar memory cells. The second semiconductor chip 20 may correspond to a peripheral circuit chip including peripheral circuits to drive the memory cells. This will now be described below in detail.

Figure 3:
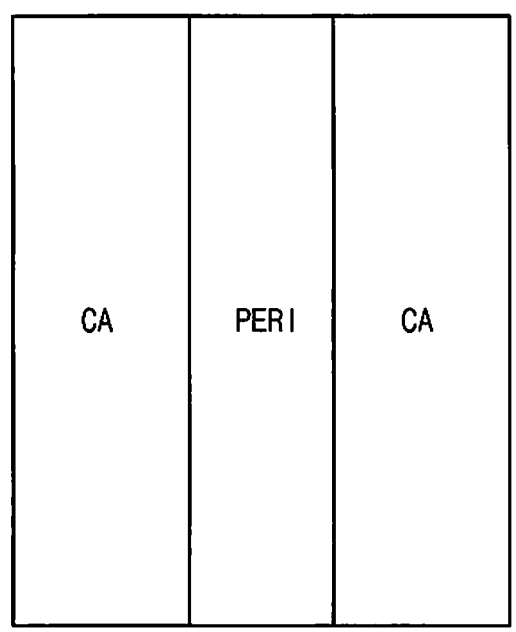
FIG. 3 is a layout view of circuit regions in a typical semiconductor memory chip.

FIG. 3 is a layout view of circuit regions in a typical semiconductor memory chip.

Referring to FIG. 3, a memory chip 150 may include a cell array region CA and a peripheral circuit region PERI. A plurality of memory cells may be disposed in the cell array region CA. The peripheral circuit region PERI may include various circuits, for example, a decoder circuit and a driver circuit, to drive the memory cells. The memory chip 150 may be, for example, a phase-change random access memory (PRAM), a resistive RAM (RRAM), a magnetic RAM (MRAM), a dynamic RAM (DRAM), or a flash memory device. The memory cells may include a resistor, a capacitor, or a charge trapping layer according to types of the memory chip 150.

FIG. 4 shows a layout indicating various circuit blocks in a cell array region of a DRAM device.

Referring to FIG. 4, in the case that the memory chip 150 is a DRAM, a cell array region CA includes a plurality of memory blocks BLK each including a plurality of memory cells, a bitline sense amplifier region BLSA disposed at one side of the memory block BLK, a sub-wordline driver region SWD disposed at the other side of the memory block BLK that is not opposite to the one side of the memory block BLK, and a conjunction region CJ at the corner of the memory block BLK, e.g., between the bitline sense amplifier region BLSA and the sub-wordline driver region SWD.

The bitline sense amplifier region BLSA is a region in which a bitline sense amplifier is disposed and serves to sense and amplify data stored in a memory cell and transfer a value of the data to an external entity. A sub-wordline driver may be disposed in the sub-wordline driver region SWD to control a voltage applied to a wordline of the memory cell. The conjunction region CJ is a region in which the sub-wordline driver region SWD and the bitline sense amplifier region BLSA intersect each other. For example, an internal voltage driver (not shown), a bitline equalizer (not shown), and/or a wordline driving circuit (not shown) may be appropriately disposed in the conjunction region CJ. The internal voltage driver controls a supply of an internal voltage used as a voltage source of a bitline sense amplifier.

The memory chip 150 includes both the cell array region CA and the peripheral circuit region PERI, as shown in FIG. 3.

According to an example embodiment, the cell array region CA and the peripheral circuit region PERI are separated with respect to each chip. For example, first semiconductor chips 10 includes the cell array region CA without the peripheral circuit region PERI (see FIG. 5) and a second semiconductor chip 20 includes the peripheral circuit region PERI without the cell array region CA (see FIG. 6). In the case that the first semiconductor chip 10 include memory cells of a DRAM, the second semiconductor chip 20 may further include at least one of the conjunction region CJ and the bitline sense amplifier region BLSA, which is included in a cell array region CA of a typical DRAM chip (see FIG. 4).

Figure 5:
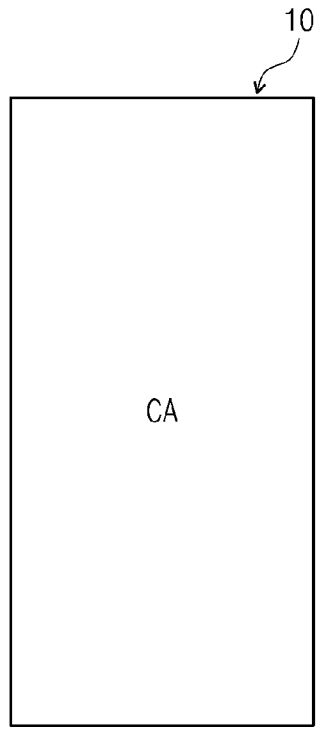
FIG. 5 is a block diagram of a first semiconductor chip in FIG. 1.
Figure 6:
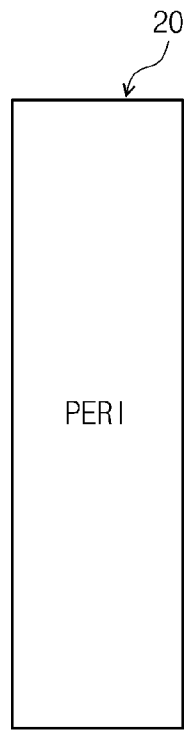
FIG. 6 is a block diagram of a second semiconductor chip in FIG. 1.
Figure 7:
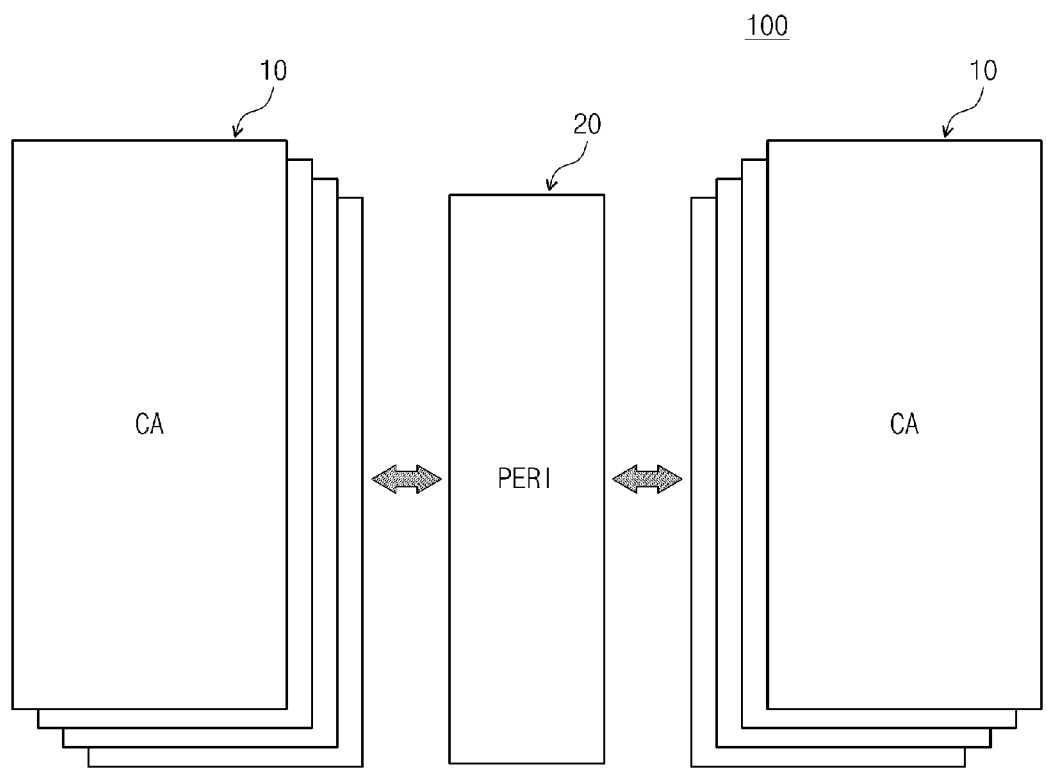
FIG. 7 shows a relationship between a plurality of first semiconductor chips as illustrated in FIG. 5 and one common second semiconductor chip as illustrated in FIG. 6.

FIG. 7 shows a relationship between a plurality of first semiconductor chips as illustrated in FIG. 5 and one common second semiconductor chip as illustrated in FIG. 6.

Referring to FIGS. 1, 2, and 7, an electrical signal may be transmitted to memory cells in the cell array regions CA of the eight first semiconductor chips 10 through the second semiconductor chip 20 including a common peripheral circuit region PERI. Thus, the electrical signal passes through one common interface (corresponding to the second semiconductor chip 20) to access memory cells of the eight first semiconductor chips 10. Accordingly, a semiconductor package 100 including the first semiconductor chips 10 and the second semiconductor chip experiences a capacitance associated with a single semiconductor chip (e.g., the second semiconductor chip 20) apart from an input capacitance of the semiconductor package 100. As a result, an input capacitance of the semiconductor package may decrease. Thus, an RC delay may decrease, thereby accomplishing a higher speed.

Unlike this, in the case that the typical semiconductor memory chips 150 as illustrated in FIG. 3 are vertically stacked (and connected in parallel) on the package substrate 1, a signal passes through the peripheral circuit region PERI included in the respective memory chips 150 to be transmitted to memory cells included in the respective memory chips 150. Thus, an input capacitance of the semiconductor package includes capacitances of the respective memory chips 150 in addition to the input capacitance of a package substrate. Accordingly, if the eight same memory chips 150 are vertically stacked and mounted in a single semiconductor package, the input capacitance of the single semiconductor package is equal to the sum of an input capacitance of a package substrate and capacitances of the respective eight memory chips 160. Accordingly, an input capacitance value of the semiconductor package may increase. Thus, an RC delay may increase, thereby making it difficult to accomplish a higher speed.

By providing the first semiconductor chips 10 each including the same or similar cell array region CA and the second semiconductor chip 20 including the peripheral circuit region PERI, a signal transmission speed of the semiconductor package 100 may be improved irrespective of increase in the number of first semiconductor chips 20 including memory cells.

Further, the semiconductor chips 10 and 20 included in the semiconductor package 100 according to an example embodiment does not have a through silicon via. Thus, a process of forming a redistribution line need not be performed, thereby reducing a process cost.

FIGS. 8 to 12 are cross-sectional views illustrating a method of manufacturing the semiconductor package in FIG. 2.

Figure 8:
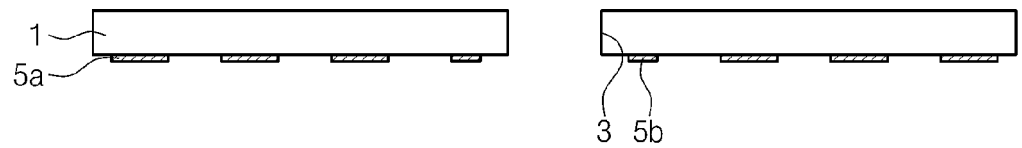
FIGS. 8 to 12 are cross-sectional views illustrating a method of manufacturing the semiconductor package in FIG. 2.

Referring to FIG. 8, the method starts with a preparation of a package substrate 1, in which a hole 3 is formed. First substrate conductive patterns 5a and second substrate patterns 5b are disposed on a bottom surface of the package substrate 1.

Figure 9:
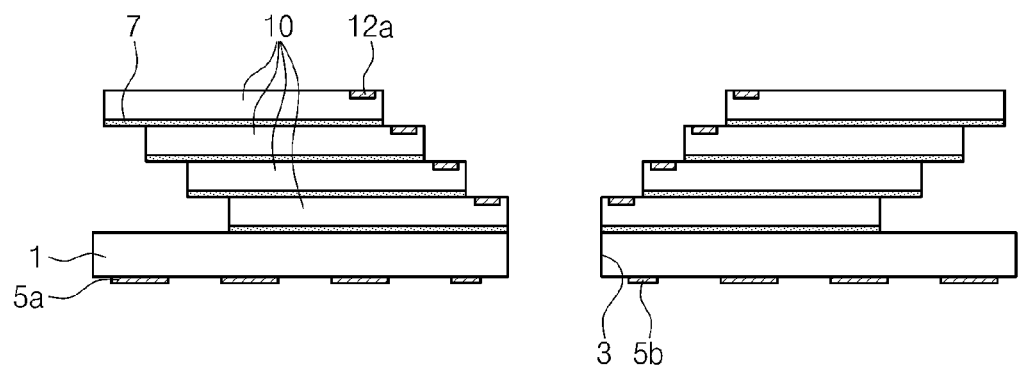

Referring to FIG. 9, first semiconductor chips 10 are sequentially attached onto the package substrate 1 using an adhesive layer 7. Edges of the semiconductor chips 10 may be stacked stepwise. First to third wiring conductive patterns 12a, 12b, and 12c may be exposed on end portions of the first semiconductor chips. For example, the first semiconductor chips 10 may be memory chips including cell array regions CA in which memory cells are disposed.

Figure 10:
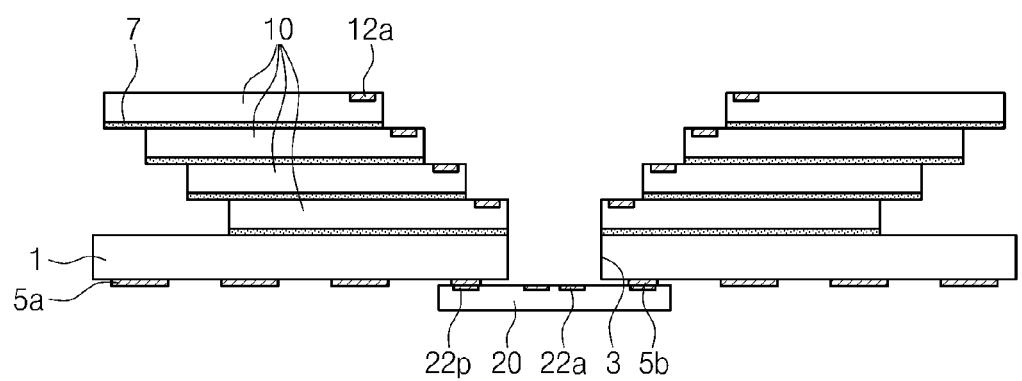

Referring to FIG. 10, a second semiconductor is mounted on a bottom surface of the package substrate 1. The second semiconductor chip 20 may include first to fourth chip conductive patterns 22a, 22b, 22c, and 22p, which are disposed at one surface of the semiconductor chip 20. The second semiconductor chip 20 may be mounted by means of flip-chip bonding. For example, the second semiconductor chip 20 may correspond to a peripheral circuit chip including a peripheral circuit region PERI. The second semiconductor chip 20 may at least partially overlap the hole 3. Thus, the hole 3 may not be entirely covered with the semiconductor chip 20. As described with reference to FIG. 1, a distance D1 between one side surface of the semiconductor chip 20 and one side surface of the hole 3, at which the hole 3 is not covered by the second semiconductor chip 20, may be 50 micrometers or more.

Figure 11:
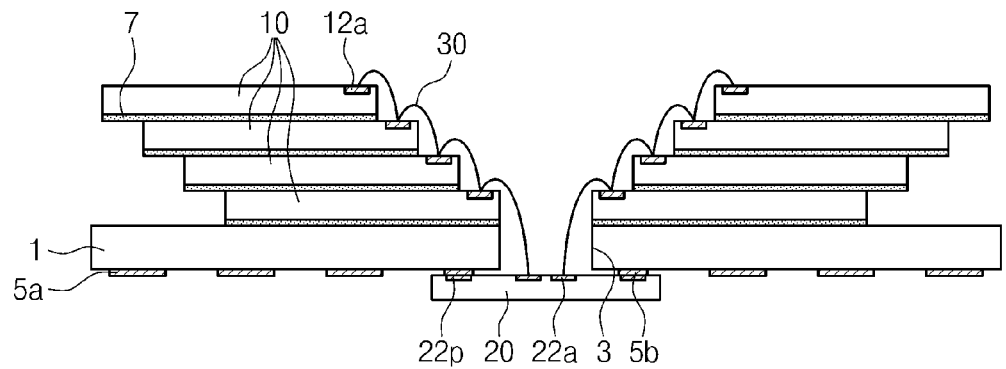

Referring to FIG. 11, the wiring conductive patterns 12a, 12b, and 12c are connected to the chip conductive patterns 22a, 22b, and 22c by a wire 30 by performing a wire bonding process, respectively. According to an example embodiment, a wire bonding process may be performed all at once after the first semiconductor chips 10 are all attached. Thus, the method of manufacturing the semiconductor package may be simplified. In a typical method of manufacturing a semiconductor package in which typical memory chips are stacked, an attaching process and a wire bonding process may be repeatedly performed with respect to each memory chip, for example, by the number of the stacked memory chips.

Figure 12:
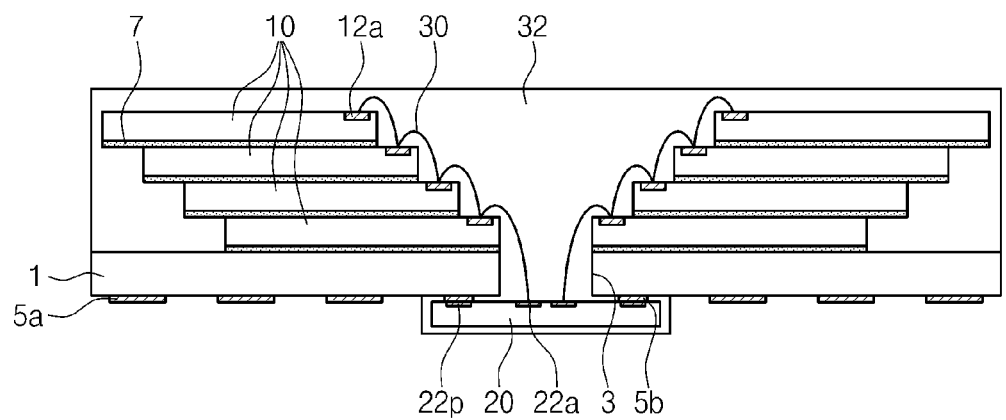

Referring to FIG. 12, a mold layer 32 is formed to cover the first semiconductor chips 10, the package substrate 1, and the second semiconductor chip 20 by performing a molding process. If the distance D1 between one side surface of the semiconductor chip 20 and one side surface of the hole 3, at which the hole 3 is not covered by the second semiconductor chip 20, is 500 micrometers or more, a resin solution for forming a mold layer may smoothly flow to side and bottom surfaces of the second semiconductor chip 20 through the hole 3. If the distance D1 is smaller than 500 micrometers, a flow of the resin solution for forming a mold layer may not be smooth and thus a void or the like may be formed in the mold layer 32.

Referring back to FIG. 2, an external solder ball 34 is attached to the first substrate conductive pattern 5a. A singulation process may be performed to divide the semiconductor package into individual semiconductor packages.

Figure 13:
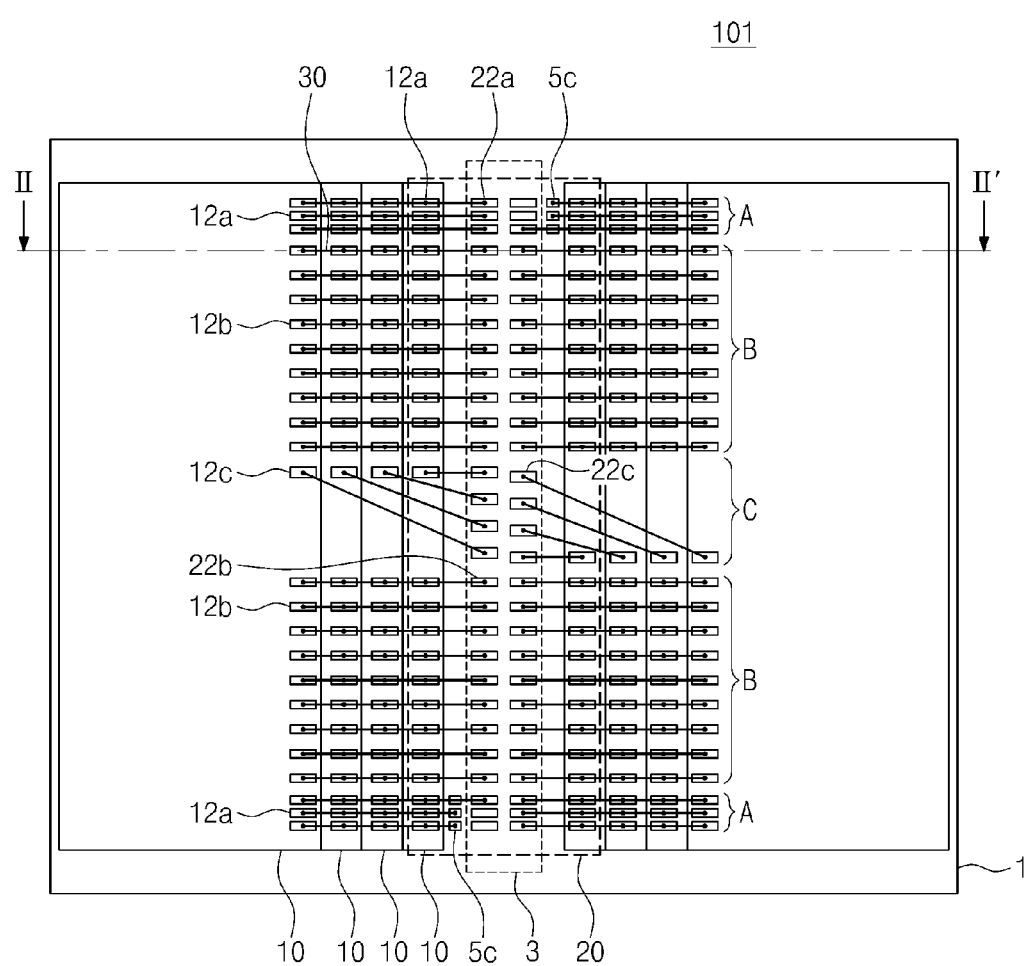
FIG. 13 shows a layout view of a semiconductor package according to another example embodiment.
Figure 14:
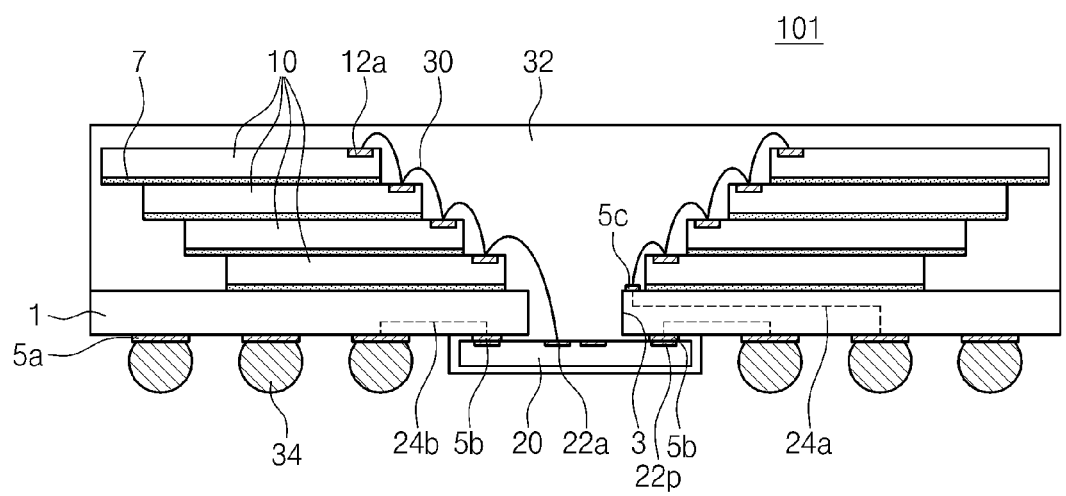
FIG. 14 is a cross-sectional view taken along the line II-II' in FIG. 13.

FIG. 13 shows a layout view of a semiconductor package 101 according to another example embodiment, and FIG. 14 is a cross-sectional view taken along the line II-II' in FIG. 13. In the semiconductor package 101, a third substrate conductive pattern 5c may be disposed on a top surface of a package substrate 1. The third substrate conductive pattern 5c may be disposed to overlap a first region "A". A side surface of a lowermost first semiconductor chip 10 may be spaced apart from a side surface of a hole 3 to expose the third substrate conductive pattern 5c. Some of the first wiring conductive patterns 12a each corresponding to a ground pin or a power pin may not be connected to a first chip conductive pattern 22a of a second semiconductor chip 20, but may be connected to the third substrate conductive pattern 5c by a wire 30. Accordingly, an external ground/power supply voltage may be applied to some of the first wiring conductive patterns 12a through a first substrate internal interconnection 24a and the third conductive pattern 5c, apart from a second semiconductor chip 20. The other components may be identical/similar to those explained with reference to FIGS. 1 and 2.

Figure 15:
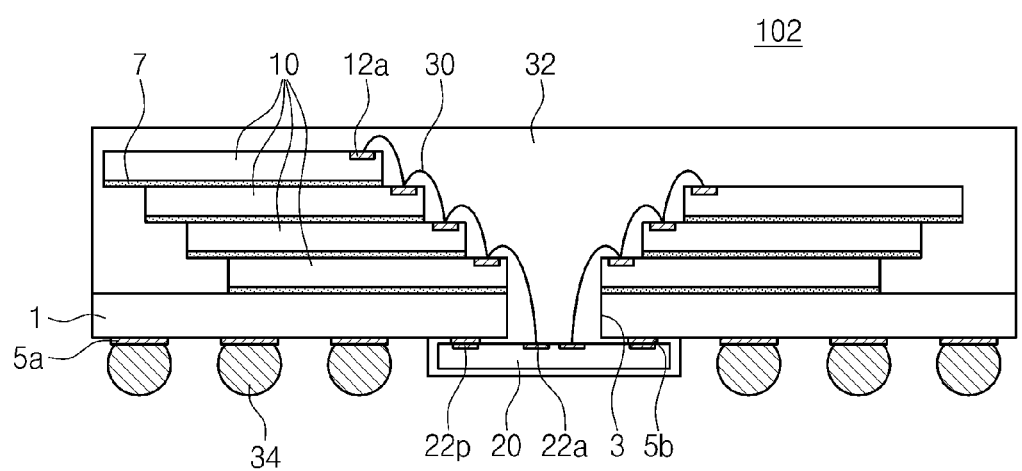
FIGS. 15 to 19 are cross-sectional views of semiconductor packages according to other example embodiments.

FIG. 15 is a cross-sectional view of a semiconductor package 102 according to another example embodiment. In the semiconductor package 102, the number of first semiconductor packages 10 stacked on both sides of a second semiconductor chip 20 may be different from each other. The other components may be identical/similar to those explained with reference to FIGS. 1 and 2.

Figure 16:
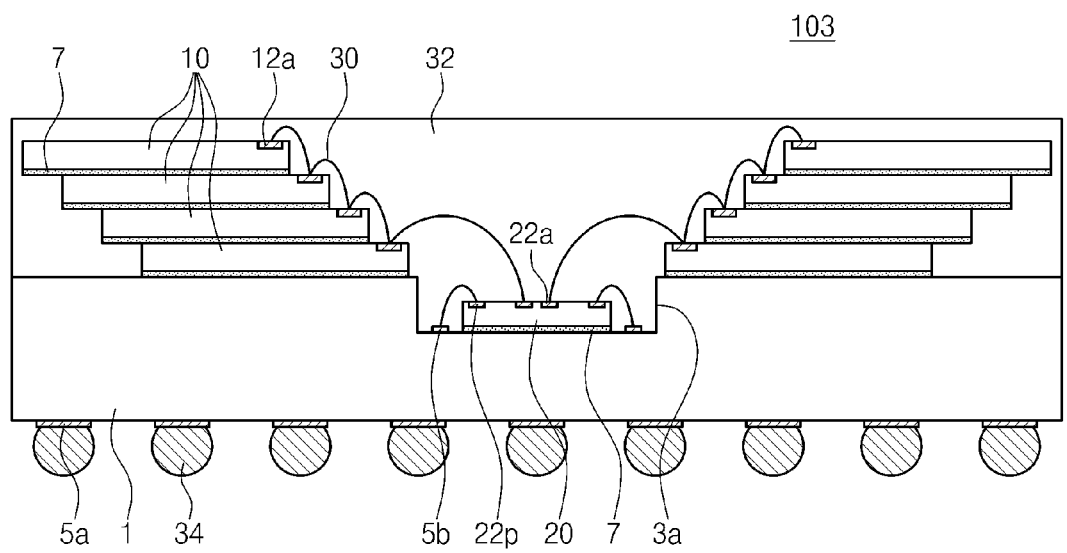

FIG. 16 is a cross-sectional view of a semiconductor package 103 according to still another example embodiment. In the semiconductor package 103, an upper recessed portion 3a (instead of a hole) may be disposed on a package substrate 1. A second substrate conductive pattern 5b may be disposed on the bottom of the upper recessed portion 3a. Further, a second semiconductor chip 5b may be disposed within the upper recessed portion 3a and may be attached onto the bottom of the upper recessed portion 3a with an adhesive layer 7 interposed therebetween. A fourth chip conductive pattern 22p of the second semiconductor chip 20 is connected to the second substrate conductive pattern 5b by a wire 30. A mold layer 32 covers the package substrate 1, the first semiconductor chips 10, and the second semiconductor chip 20 and fills the upper recessed portion 3a. The other components may be identical/similar to those explained with reference to FIG. 2.

Figure 17:
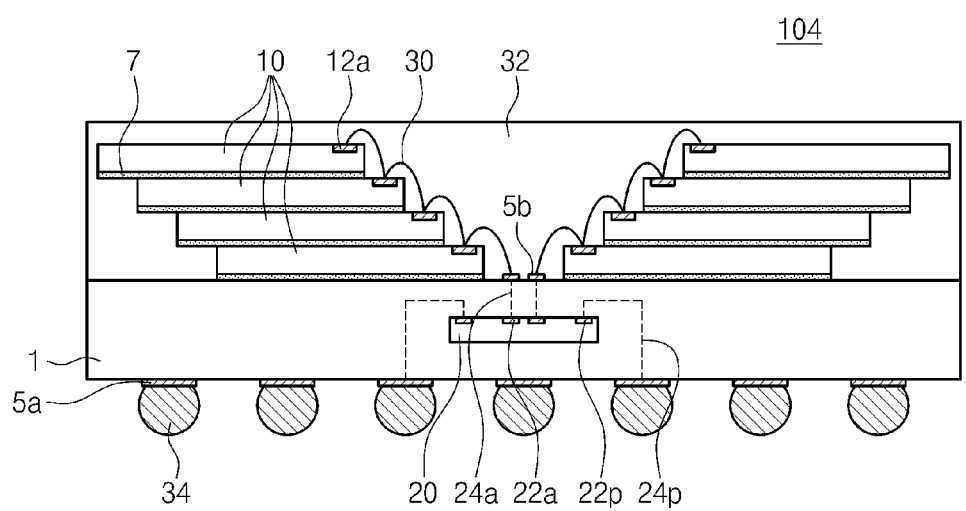

FIG. 17 is a cross-sectional view of a semiconductor package 104 according to another example embodiment. In the semiconductor package 104, a second semiconductor chip 20 is embedded in a package substrate 1. First substrate conductive patterns 5a are disposed on a bottom surface of the package substrate 1, and external solder balls 34 are attached to the first substrate conductive patterns 5a. Second substrate conductive patterns 5b are disposed on a central top surface of the package substrate 1. First to third conductive patterns 12a, 12b, and 12c of the first semiconductor chips 10 are connected to the second substrate conductive patterns 5b through wires 30. The first semiconductor chips 10 are electrically connected to the second semiconductor chip 20 by the second substrate conductive patterns 5b and a first substrate internal interconnection 24a. The second semiconductor chip 20 is electrically connected to external solder balls 34 by a second substrate internal interconnection 24p. The other components may be identical/similar to those explained with reference to FIG. 2.

Figure 18:
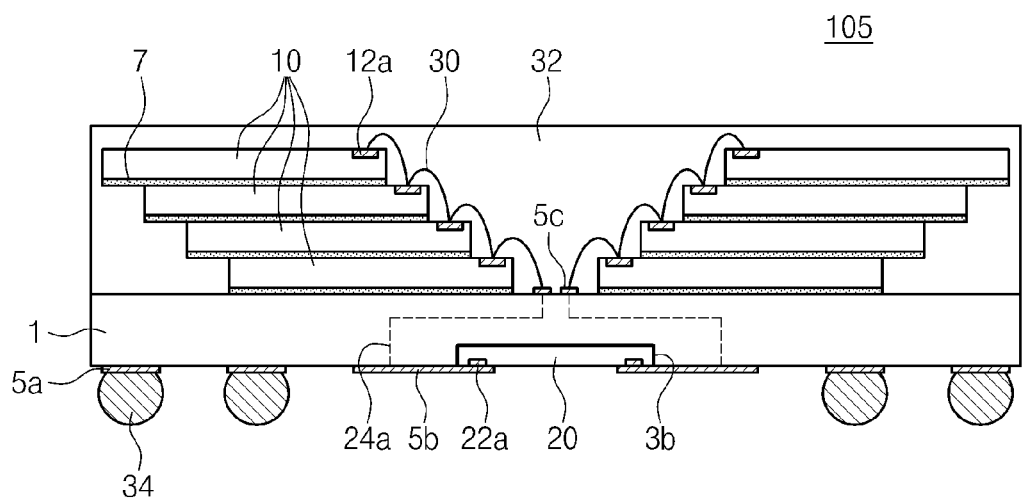

FIG. 18 is a cross-sectional view of a semiconductor package 105 according to yet another example embodiment. In the semiconductor package 105, a package substrate 1 includes a lower recessed portion 3b and a second semiconductor chip 20 is interposed within the lower recessed portion 3b. The package substrate 1 has a bottom surface on which a first substrate conductive pattern 5a and a second substrate conductive pattern 5b are disposed and a top surface on which a third substrate conductive pattern 5c is disposed. First to third wiring conductive patterns 12a, 12b, and 12c of the first conductive chips 10 are connected to the third substrate conductive pattern 5c by a wire 30. The third substrate conductive pattern 5c is electrically connected to the second semiconductor chip 20 through a first substrate internal interconnection 24a and a second substrate conductive pattern 5b. The other components may be identical/similar to those explained with reference to FIG. 2.

Figure 19:
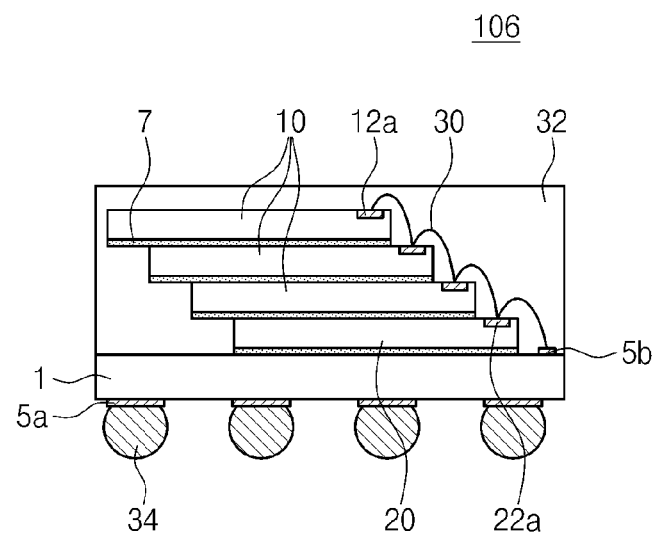

FIG. 19 is a cross-sectional view of a semiconductor package 106 according to a further example embodiment. In the semiconductor package 106, a package substrate 1 does not include a hole or a recessed portion. First substrate conductive patterns 5a are disposed on a bottom surface of the package substrate 1, and external solder balls 34 are attached to the first substrate conductive patterns 5a. Second substrate conductive patterns 5b are disposed on a top surface of the package substrate 1. A second semiconductor chip 20 is attached onto the package substrate 1, and semiconductor chips 10 are stacked stepwise on the second semiconductor chip 20. First to third chip conductive patterns 22a, 22b, and 22c are disposed at the end portion of the second semiconductor chip 20, and first to third wiring conductive patterns 12a, 12b, and 12c are disposed at the end portion of the first semiconductor chip 10. The first to third wiring conductive patterns 12a, 12b, and 12c, the first to third chip conductive patterns 22a, 22b, and 22c, and the second substrate conductive patterns 5b are connected by a wire 30, respectively. The other components may be identical/similar to those explained with reference to FIG. 2.

Figure 20:
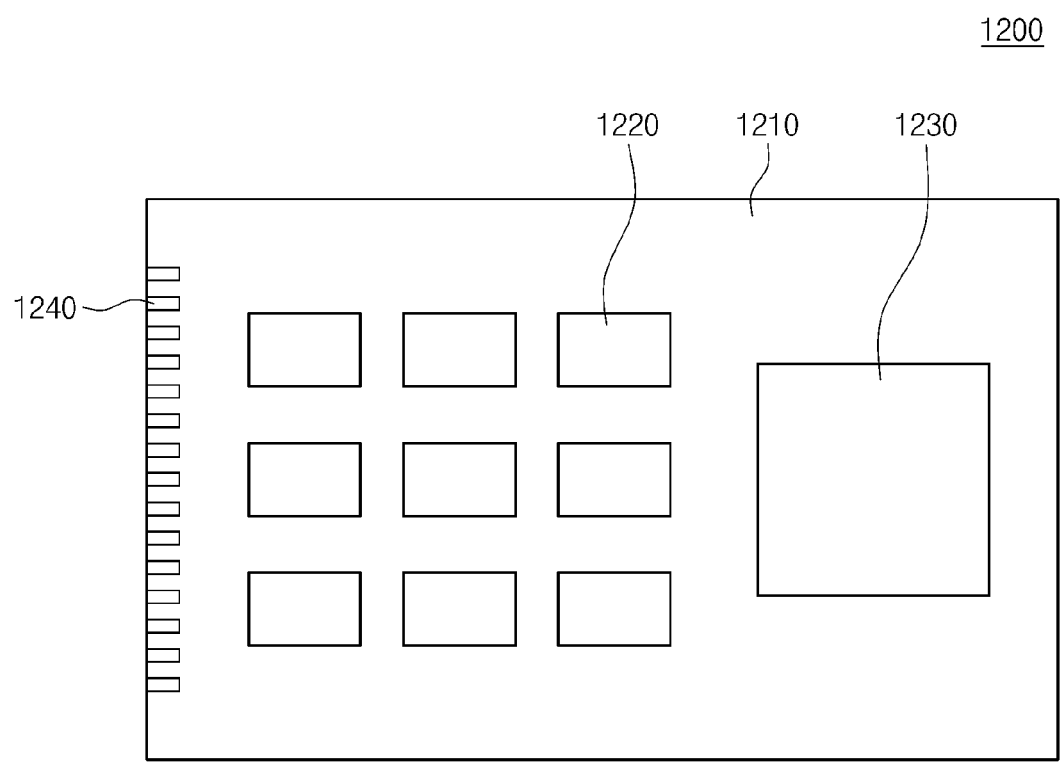
FIG. 20 is a block diagram illustrating an example of a package module including a semiconductor package according to an example embodiment.

FIG. 20 is a block diagram illustrating an example of a package module including a semiconductor package according to an example embodiment. As illustrated, a package module 1200 may include a semiconductor integrated circuit chip 1220 and a quad flat package (QFP) packaged semiconductor integrated circuit chip 1230, to some of which the semiconductor package technologies according to example embodiments are applied. The package module 1200 may be formed by mounting the semiconductor elements 1220 and 1230 on a substrate 1210. The package module 1200 may be connected to an external electronic device through an external connection terminal 1240 disposed at one side of the substrate 1210.

Figure 21:
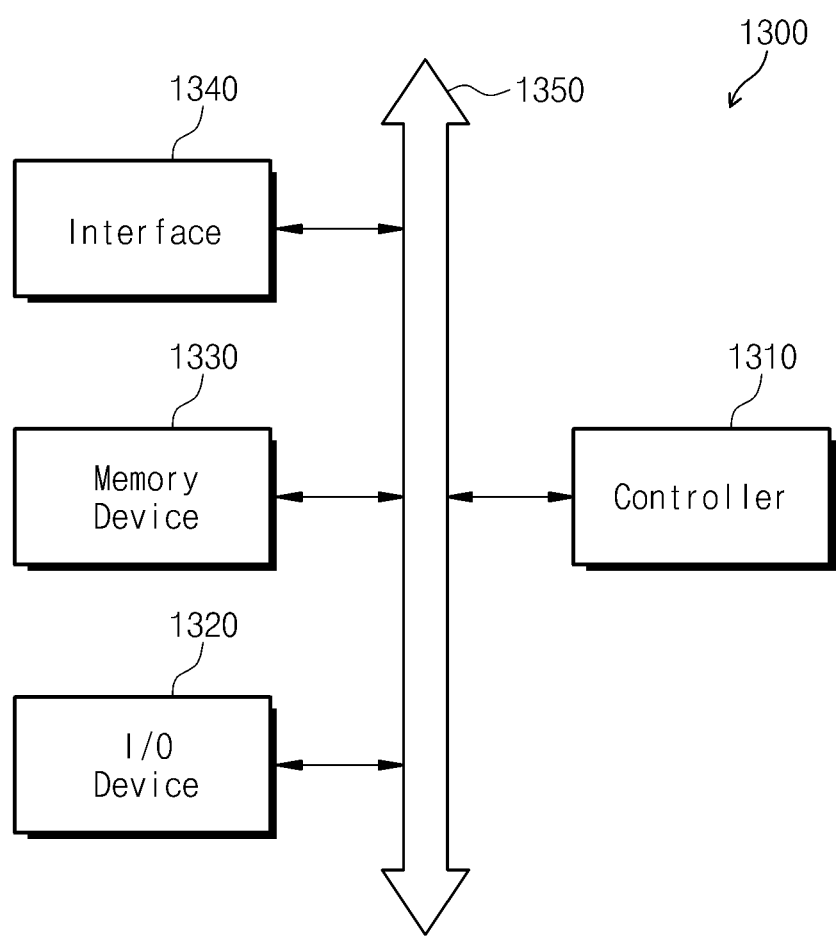
FIG. 21 is a block diagram illustrating an example of an electronic system including a semiconductor package according to an example embodiment.

The semiconductor package technologies according to example embodiments may be applied to electronic systems. FIG. 21 is a block diagram illustrating an example of an electronic system including a semiconductor package according to an example embodiment. As illustrated, an electronic system 1300 may include a controller 1310, an input/output (I/O) device 1320, and a memory device 1330. The controller 1310, the I/O device 1320, and the memory device 1330 may be connected through a bus 1350. The bus 1350 may be a path through which data are transmitted. For example, the controller 1310 may include, for example, at least one microprocessor, a digital signal processor, a microcontroller, or at least one of logic devices performing similar functions. The controller 1310 and the memory device 1330 may include a semiconductor package according to an example embodiment. The I/O device 1320 may include, for example, a keypad, a keyboard, and/or a display device. The memory device 1330 may include, for example, a volatile memory device and/or a nonvolatile memory device. For example, the memory device 1330 may be formed of a flash memory device. For example, a semiconductor package including a flash memory device and formed in accordance with an example embodiment may be mounted on a data processing system, for example, a mobile device or a desktop computer. The flash memory devices included in the semiconductor package may be configured to form a solid-state disk (SSD). In this case, the electronic system 1300 may stably store mass data in the flash memory. The electronic system 1300 may further include an interface 1340 to transmit/receive data to/from a communication network. The interface 1340 may be a wired/wireless interface. For example, the interface 1340 may include, for example, an antenna or a wired/wireless transceiver. Although not shown, it should be apparent to those skilled in the art that, for example, an application chipset, a camera image processor (CIS) and/or an I/O device may be further provided in the electronic system 1300.

The electronic system 1300 may be embodied by, for example, a mobile system, a personal computer, an industrial computer, or a logic system which performs various functions. For example, the mobile system may include any one of a personal digital assistant (PDA), a portable computer, a web tablet, a mobile phone, a wireless phone, a laptop computer, a memory card, a digital music system, and an information transmission/reception system. When the electronic system 1300 is a wireless communicable apparatus, the electronic system 1300 may be used in a communication interface protocol of a third-generation communication system, for example, a code division multiple access (CDMA), global system for mobile communication (GSM), North American digital cellular (NADC), enhanced-time division multiple access (E-TDMA), wideband code division multiple access (WCDMA), or CDMA2000.

Figure 22:
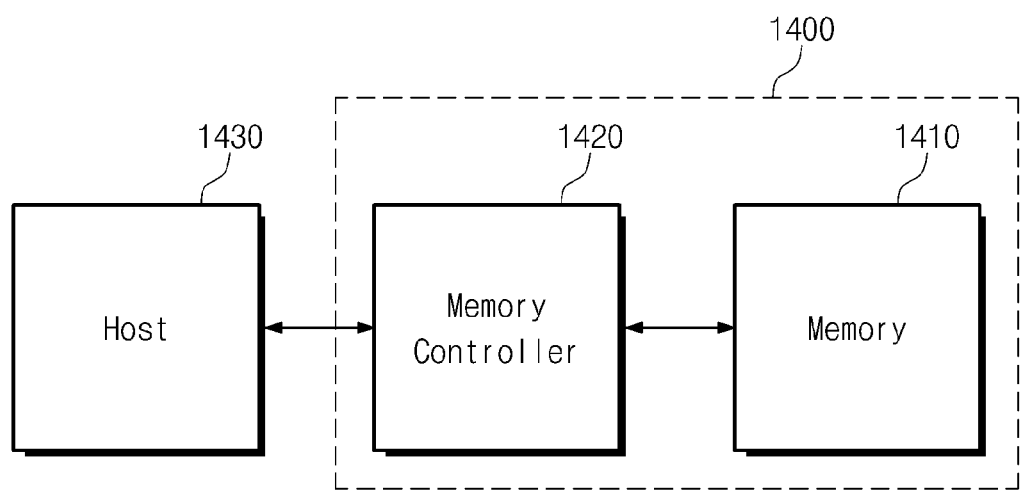
FIG. 22 is a block diagram illustrating an example of a memory system including a semiconductor package according to an example embodiment.

A semiconductor package according an example embodiment may be provided in the form of a memory card. FIG. 22 is a block diagram illustrating an example of a memory system including a semiconductor package according to an example embodiment. As illustrated, a memory card 1400 may include a nonvolatile memory device 1410 and a memory controller 1420. The nonvolatile memory device 1410 and the memory controller 1420 may store data therein or read stored data. The nonvolatile memory device 1410 may include two or more nonvolatile memory chips, which are embodied in a semiconductor package according to an example embodiment. The memory controller 1410 may control the nonvolatile memory device 1410 to read stored data or store data in response to a read/write request of a host.

As described so far, in a semiconductor package according to example embodiments, a cell array region and a peripheral circuit region are separated to be formed as different semiconductor chips, respectively. A plurality of first semiconductor chips including cell array regions and a single second semiconductor chip including a peripheral circuit region are electrically connected to each other. Thus, an input capacitance of a semiconductor package includes a loading capacitance with respect to the second semiconductor chip, but does not experience loading capacitances with respect to the respective first semiconductor chips, making single loading possible. As a result, an input capacitance of a semiconductor package may decrease. Thus, an RC delay can be reduced, thereby accomplishing a higher speed. Further, in a method of fabricating a semiconductor package according to an example embodiment, a wire bonding process may be performed only once, thereby achieving process simplification.

While example embodiments have been particularly shown and described with reference to some example embodiments described above, it will be apparent to those of ordinary skill in the art that various changes in form and detail may be made therein without departing from the spirit and scope of example embodiments, which is defined by the following claims.

What is claimed is:

1. A semiconductor package comprising:
   a package substrate including a top surface, a bottom surface, and an opening;
   a first semiconductor chip at a central region of the package substrate, the first semiconductor chip including peripheral circuits in a peripheral circuit region; and
   a plurality of second semiconductor chips on a first region and a second region of the package substrate, the opening disposed between the first region and the second region of the package substrate, each of the plurality of second semiconductor chips including a cell array region in which memory cells are disposed,
   wherein the peripheral circuits in the first semiconductor chip are configured to drive the memory cells in the second semiconductor chips,
   wherein the first semiconductor chip partially overlaps with the opening and does not entirely cover the opening.

2. The semiconductor package of claim 1, wherein the peripheral circuit region further includes at least one of a conjunction region and a bitline sense amplifier region.

3. The semiconductor package of claim 1, wherein
   the first semiconductor chip and the second semiconductor chips are electrically connected to each other by wires disposed through the opening.

4. The semiconductor package of claim 3, further comprising:
   a mold layer covering the first semiconductor chip and the second semiconductor chips and filling the opening.

5. The semiconductor package of claim 3, wherein
   a portion of the opening is exposed by the first semiconductor chip, and
   a distance between one side surface of the first semiconductor chip and one side surface of the opening is about 500 μm or more.

6. The semiconductor package of claim 3, wherein
the package substrate includes a substrate conductive pattern on a top surface of the package substrate and adjacent to the opening,
the second semiconductor chips include wiring conductive patterns at their respective end portions, and
some of the wiring conductive patterns are connected to the substrate conductive pattern by a wire.

7. The semiconductor package of claim 6, wherein a ground/power supply voltage is applied to the substrate conductive pattern.

8. The semiconductor package of claim 1, wherein
the second semiconductor chips are identical to each other,
the first semiconductor chip includes a first side and a second side being opposite to the first side, and
a first group of the second semiconductor chips at the first side of the first semiconductor chip and a second group of the second semiconductor chips at the second side of the first semiconductor chip are symmetrically disposed to each other about a vertical axis running through a center of the package substrate.

9. The semiconductor package of claim 1, wherein
the second semiconductor chips are identical to each other, and
a number of the second semiconductor chips at a first side of the first semiconductor chip is different from a number of the second semiconductor chips at a second side of the first semiconductor chip, the second side of the first semiconductor chip being opposite to the first side of the semiconductor chip.

10. A semiconductor package comprising:
a package substrate;
a plurality of first semiconductor chips each including memory cells; and
a second semiconductor chip including peripheral circuitry common to the first semiconductor chips, the peripheral circuitry configured to drive together the memory cells in two or more of the first semiconductor chips, wherein
each of the first semiconductor chips does not include a peripheral circuitry configured to drive the memory cell and the second semiconductor chip does not include a memory cell,
the package substrate includes a top surface, a bottom surface, and an opening defined at a location,
the first semiconductor chips are on the top surface,
the second semiconductor chip is on the bottom surface and overlaps with the opening, and
the second semiconductor chip does not entirely cover the opening.

11. A semiconductor package comprising:
a package substrate including a bottom surface, a top surface, and a hole;
a peripheral circuit chip at a central region of the bottom surface of the package substrate, wherein the peripheral circuit chip overlaps the hole; and
a plurality of memory chips including first to Nth memory chips on the top surface of the package substrate at both sides of the peripheral circuit chip,
wherein a second memory chip is stacked on the first memory chip by partially overlapping the first memory chip,
wherein the Nth memory chip is stacked on a N-1th memory chip by partially overlapping the N-1th memory chip,
wherein the Nth memory chip does not overlap with the hole, and
where "N" denotes a natural number of 2 or more.

* * * * *